(12) United States Patent
Camp, Jr.

(10) Patent No.: US 6,480,046 B1
(45) Date of Patent: Nov. 12, 2002

(54) TRANSMITTER APPARATUS AND METHODS USING FREQUENCY DOUBLING MODULATION

(75) Inventor: William O. Camp, Jr., Chapel Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/931,546

(22) Filed: Aug. 16, 2001

(51) Int. Cl.[7] ............................................. H03B 19/00
(52) U.S. Cl. ...................................... 327/122; 327/156
(58) Field of Search ................................ 327/355, 105, 327/107, 122, 156, 113

(56) References Cited

U.S. PATENT DOCUMENTS 5,180,994 A * 1/1993 Martin et al. ................... 331/38
5,446,422 A * 8/1995 Mattila et al. ............... 375/216
5,684,261 A * 11/1997 Luo ............................. 84/609

OTHER PUBLICATIONS

Zhang et al., "A 930MHz CMOS DC–Offset–Free Direct-Conversion 4–FSK Receiver," 2001 IEEE International Solid–State Circuits Conference, Paper 18.4, Feb. 5–7, 2001, pp. 290–291 and 456.

Zhang et al. "A 930 MHz CMOS DC–Offset–Free Direct-Conversion 4–FSK Receiver," ISSCC 2001 Visuals Supplement, Paper 18.4, Feb. 5–7, 2001, pp. 232–233 and 474.

Darabi et al., "A 2.4 GHz CMOS Transceiver for Bluetooth," 2001 IEEE International Solid–State Circuits Conference, Paper 13.3, Feb. 5–7, 2001, pp. 200–201 and 447.

Darabi et al., "A 2.4 GHz CMOS Transceiver for Bluetooth," ISSCC 2001 Visuals Supplement, Paper 13.3, Feb. 5–7, 2001, pp. 160–161 and 434.

Yue, Stephen, "Linearization Techniques for Mixers," Apr. 9, 2001, 13 pages, Available at www.eecg.toronto.edu/kphang/ece1371/termpaper.html.

\* cited by examiner

*Primary Examiner*—Dinh T. Le
(74) *Attorney, Agent, or Firm*—Myers Bigel Sibley & Sajovec

(57) ABSTRACT

An oscillator signal having a first frequency is generated. A frequency-doubled modulated output signal is produced from the oscillator signal, the frequency-doubled modulated output signal modulated according to a modulation signal and having a second frequency that is about twice the first frequency. The frequency-doubled modulated output signal is amplified and transmitted in a communications medium. In some embodiments, the frequency-doubled modulated output signal may be generated from an oscillator signal using a frequency doubling vector modulator circuit. In other embodiments, the oscillator signal may be phase-modulated, and the frequency-doubled modulated output signal may be generated from the phase-modulated oscillator signal by a frequency-doubling amplitude modulator circuit.

33 Claims, 8 Drawing Sheets

TRANSMITTER APPARATUS AND METHODS USING FREQUENCY DOUBLING MODULATION

BACKGROUND OF THE INVENTION

The present invention relates to communications apparatus and methods, and more particularly, to transmitter circuits and methods of operation thereof.

Transmitter circuits used in radio communications devices, such as wireless telephones, wireless base stations and similar apparatus, typically include an oscillator circuit that generates a periodic signal that is modulated by an information-bearing signal. The modulated signal typically is amplified by a power amplifier circuit, which produces an amplified signal that is transmitted into a communications medium via an antenna.

For example, a conventional "direct modulation" transmitter circuit may include a master oscillator circuit, such as a voltage controlled oscillator (VCO) circuit, that generates a master oscillator signal that is modulated by an information-bearing signal, for example, at the master oscillator circuit itself or downstream of the master oscillator circuit. The modulated signal may be amplified by a power amplifier circuit and transmitted from an antenna, such that the transmitted output signal has the same frequency as the master oscillator signal. A potential drawback of such a transmitter structure is that the output signal from the power amplifier may leak back from the antenna to the master oscillator circuit. This may disturb the phase of the master oscillator signal and degrade the spectrum and/or Error Vector Magnitude (EVM) of the transmitted output signal.

One conventional approach for reducing such undesirable effects is to improve electrical isolation between the power amplifier output and the master oscillator circuit. Another conventional approach includes making the master oscillator signal have a frequency that is an integer multiple of the output frequency, with the master oscillator signal being divided down to the output frequency at some point before generation of the output signal. Yet another conventional approach includes using a master oscillator frequency that is $2/3$ of the output frequency, with the master oscillator signal being divided by 2 and added to itself to make the final output frequency.

Each of these approaches may have drawbacks. Relying on isolation between the power amplifier output and the master oscillator circuit may produce uncertain and variable results. Using a higher frequency master oscillator signal that is subsequently divided down may result in additional noise that may not be offset by the frequency divider and may lead to excessive power consumption. Generation of multiple frequencies may also increase the likelihood of spurious signal components in the output signal.

SUMMARY OF THE INVENTION

In embodiments of the present invention, an oscillator signal having a first frequency is generated. A frequency-doubled modulated output signal is produced from the oscillator signal, the frequency-doubled modulated output signal modulated according to a modulation signal and having a second frequency that is about twice the first frequency. The frequency-doubled modulated output signal is amplified and transmitted in a communications medium. In some embodiments, the frequency-doubled modulated output signal may be generated from an oscillator signal using a frequency doubling vector modulator circuit. In some other embodiments, the oscillator signal may be phase-modulated, and the frequency-doubled modulated output signal may be generated from the phase-modulated oscillator signal by a frequency-doubling amplitude modulator circuit. The invention may be embodied as apparatus or methods.

DETAILED DESCRIPTION

The present invention will now be described more fully with reference to the accompanying drawings, in which typical embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The present invention relates to transmitter apparatus and methods. It will be appreciated that the present invention is applicable to transmitter applications in radio communications equipment such as wireless telephones and wireless base stations. However, it will also be appreciated that the present invention is also generally applicable to a wide variety of wireless, wireline and other transmitter applications.

Figure 1:
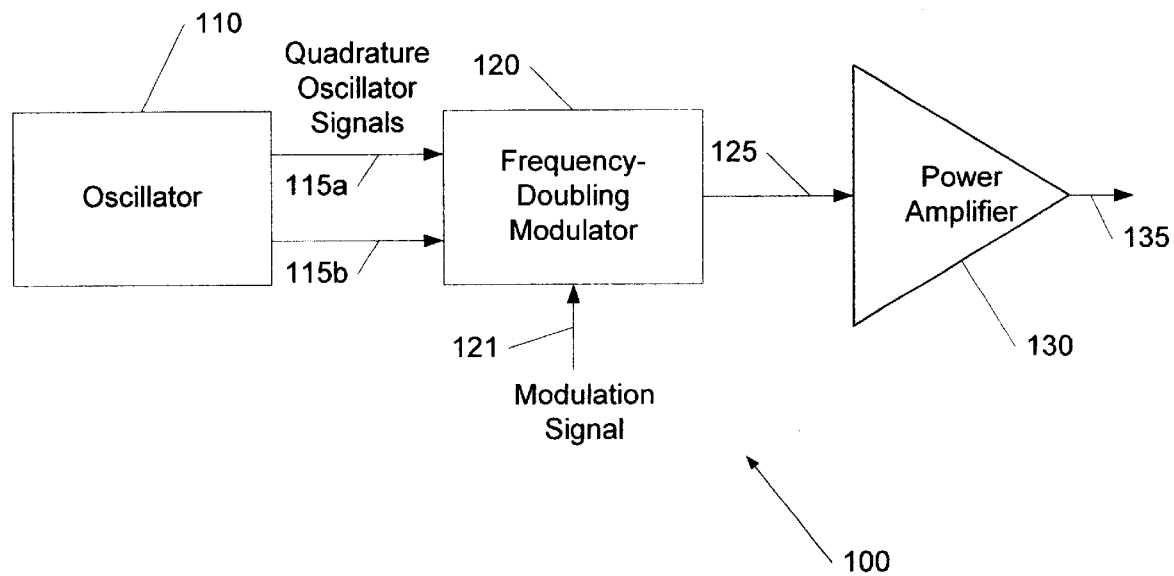
FIG. 1 is a schematic diagram illustrating a transmitter circuit according to embodiments of the present invention.

FIG. 1 illustrates a transmitter circuit 100 according to embodiments of the present invention. The transmitter circuit 100 includes an oscillator circuit 110 that generates first and second oscillator signals 115*a*, 115*b* that are in quadrature (90 degree phase-shifted) relationship to one another. The quadrature oscillator signals 115*a*, 115*b* (which may comprise, for example, respective pairs of differential signals) are provided to a frequency doubling modulator circuit 120. The frequency doubling modulator circuit 120 produces an output signal 125 that has a frequency that is about twice the frequency of the quadrature oscillator signals 115*a*, 115*b* and that is modulated according to a modulation signal 121 (which also may comprise, for example, a differential pair of signals). The output signal 125 is applied to a power amplifier circuit 130, which generates an amplified signal 135 therefrom. The amplified signal 135 may be transmitted in a wireless, wireline or other communications medium.

It will be appreciated that the transmitter circuit 100 may be included in a number of different types of apparatus, for example, in a transmitter section of a cellular telephone or other radio communications device. It will also be appreciated that the oscillator circuit 110, the modulator circuit 120 and the power amplifier circuit 130 may be implemented using a variety of circuit configurations comprising analog circuitry, digital circuitry or combinations thereof. It will be further appreciated that the transmitter circuit 100 may include a number of additional components, such as additional amplifiers, mixers, filters, and other signal processing circuits. For example, a bandpass filter may be inserted between the frequency doubling modulator circuit 120 and the power amplifier circuit 130 to attenuate noise that may be generated by the modulator circuit 120. The desirability of such a circuit may, for example, be dependent upon out of band noise performance desired for the transmitter circuit 100.

Figure 2:
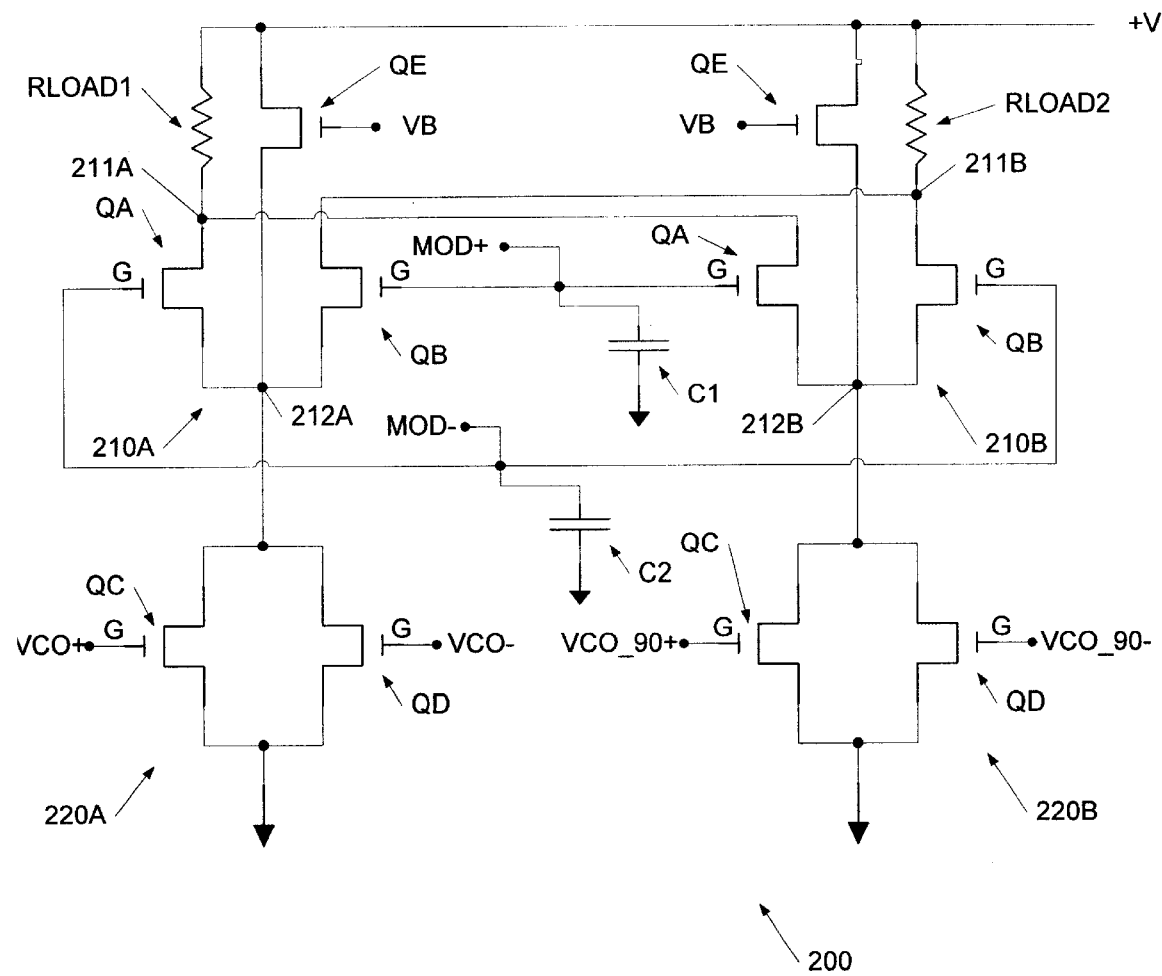
FIG. 2 is a schematic diagram illustrating a frequency-doubling modulator circuit according to embodiments of the present invention.

As shown in FIG. 2, according to some embodiments of the present invention, a frequency doubling modulator circuit 200 includes first and second cross-coupled differential amplifier circuits 210A, 210B that share load resistors RLOAD1, RLOAD2 that are coupled to a voltage bus V+. The cross-coupled differential amplifier circuits 210A, 210B include respective differential pairs of transistors QA, QB, and control currents passing from first and second nodes 211A, 211B to respective third and fourth nodes 212A, 212B responsive to a differential pair of modulation signals MOD+, MOD– applied to modulation signal inputs (here shown as gate terminals G of the transistors QA, QB) of the cross-coupled differential amplifier circuits 210A, 210B. An input filter circuit, here shown as including capacitors C1, C2, may be provided at the modulation signal inputs of the cross-coupled differential amplifier circuits 210A, 210B. In radio-frequency transmitter applications, the input filter may be configured to attenuate radio-frequency signal components at the modulation signal inputs of the cross-coupled differential amplifier circuits 210A, 210B.

The modulator circuit 200 further includes third and fourth differential amplifier circuits 220A, 220B coupled to respective ones of the third and fourth nodes 212A, 212B of the cross-coupled differential amplifier circuits 210A, 210B. The third and fourth differential amplifier circuits 220A, 220B include respective differential pairs of transistors QC, QD, and are operative to control current transfer from respective ones of the third and fourth nodes 212A, 212B responsive to respective ones of first and second differential pairs of quadrature oscillator signals VCO+/−, VCO_90+/− applied to gate terminals G of the transistors QC, QD. The modulator circuit 200 is operative to generate an output signal, e.g., a voltage between the first and second nodes 211A, 211B of the cross-coupled differential amplifier circuits 210A, 210B, that is doubled in frequency with respect to the oscillator signals VCO+/−, VCO_90+/−, and that is modulated according to the modulation signals MOD+/−. It will be appreciated that the output signal may be derived in other ways, for example, by generating respective differential output signals from respective voltages at the first and second nodes 211A, 211B. As shown, shunt transistors QE that are responsive to a bias voltage VB may be provided in the differential amplifier circuits 210A, 210B to provide means for reducing flicker noise in the circuit 200.

Figure 3:
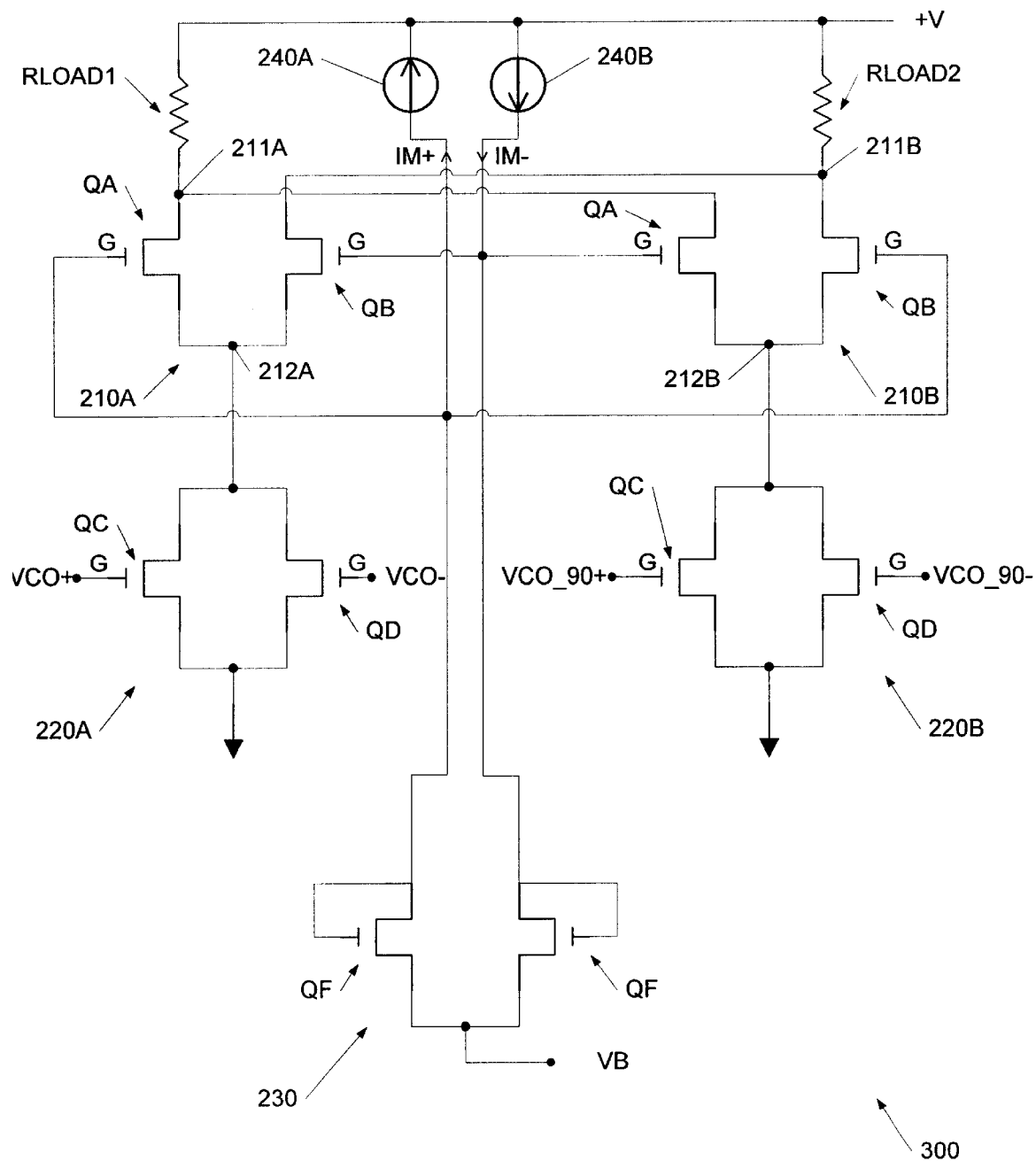
FIG. 3 is a schematic diagram illustrating a frequency-doubling modulator circuit according to other embodiments of the present invention.

FIG. 3 illustrates a frequency doubling modulator circuit 300 that is similar to the modulator circuit 200 of FIG. 2, with like elements being indicated by like reference numerals. The modulator circuit 300, however, includes a current mirror circuit 230 coupled to the first and second differential amplifier circuit 210A, 210B. The current mirror circuit 230 includes a differential pair of transistors QF coupled in a current mirror configuration, biased by a bias voltage VG. The current mirror circuit 230 receives modulation signals in the form of modulation currents IM+/− generated by current sources 240A, 240B. Such a configuration may provide improved linearity over the configuration illustrated in FIG. 2. It will be appreciated that the current sources 240A, 240B may comprise any of a variety of different circuits.

Figure 4:
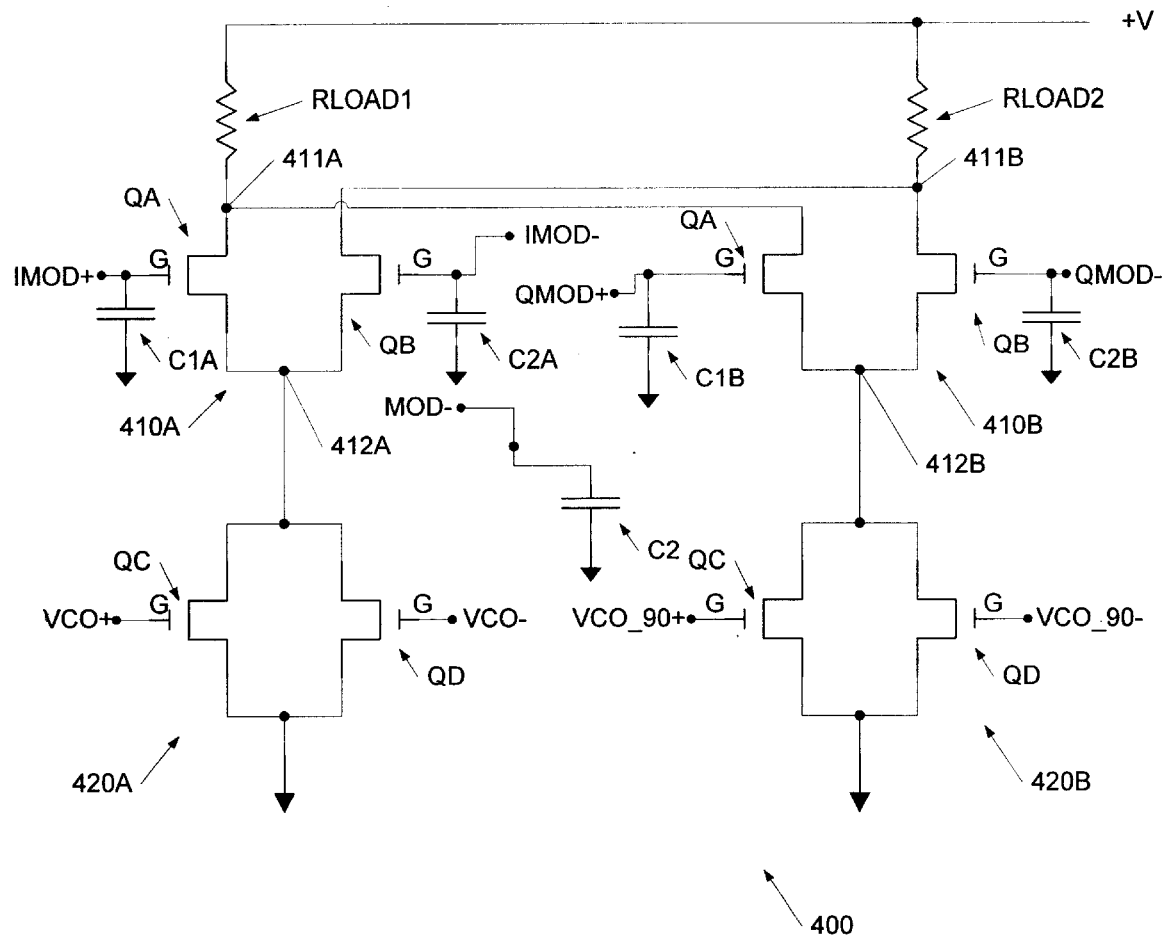
FIG. 4 is a schematic diagram illustrating a frequency-doubling modulator circuit according to further embodiments of the present invention.

Referring to FIG. 4, a frequency doubling modulator circuit 400 according to other embodiments represents a modification of the modulator circuit 200 of FIG. 2 to provide for use of quadrature modulation signals IMOD+/−, QMOD+/−. The frequency doubling modulator circuit 400 includes first and second cross-coupled differential amplifier circuits 410A, 410B that share load resistors RLOAD1, RLOAD2 coupled to a voltage bus V+. The cross-coupled differential amplifier circuits 410A, 410B include respective differential pairs of transistors QA, QB, and control currents passing from first and second nodes 411A, 411B to respective third and fourth nodes 412A, 412B responsive to respective differential pairs of modulation signals IMOD+/−, QMOD+/− applied to gate terminals G of the transistors QA, QB. Respective input filter circuits, here shown as including capacitors C1A, C2A, C1B, C2B, are provided at respective modulation signal inputs (here, the gate terminals G of the transistors QA, QB) of the cross-coupled differential amplifier circuits 410A, 410B. In radio-frequency transmitter applications, the input filters C1A, C2A, C1B, C2B may be configured to attenuate radio-frequency signal components at the modulation signal inputs of the cross-coupled differential amplifier circuits 210A, 210B. Shunt transistors or equivalent circuitry (not shown) may be included in the differential amplifier circuits 410A, 410B to reduce flicker noise in the circuit 400.

The modulator circuit 400 further includes third and fourth differential amplifier circuits 420A, 420B coupled to respective ones of the third and fourth nodes 412A, 412B of the cross-coupled differential amplifier circuits 410A, 410B. The third and fourth differential amplifier circuits 220A, 220B include respective differential pairs of transistors QC, QD, and are operative to control currents from respective ones of the third and fourth nodes 412A, 412B responsive to respective ones of first and second differential pairs of quadrature oscillator signals VCO+/−, VCO_90+/− applied to gate terminals of the transistors QC, QD. The modulator circuit 400 is operative to generate a signal, e.g., a voltage between the first and second nodes 411A, 411B of the cross-coupled differential amplifier circuits 410A, 410B, that is doubled in frequency with respect to the oscillator signals VCO+/−, VCO_90+/−, and that is modulated according to the modulation signals IMOD+/−, QMOD+/−.

Figure 5:
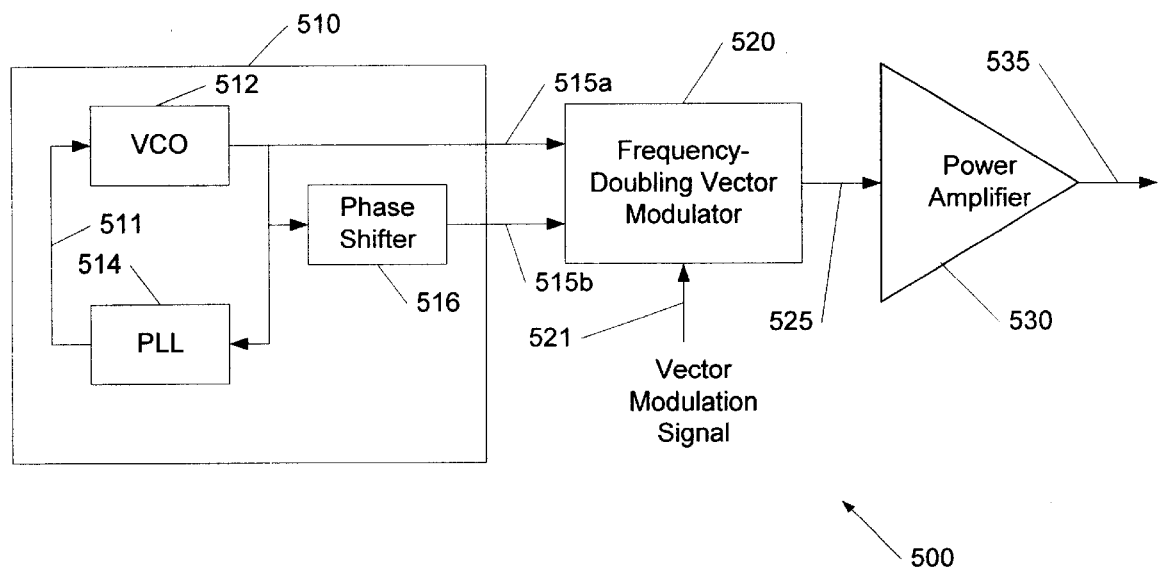
FIG. 5 is a schematic diagram illustrating a transmitter circuit according to additional embodiments of the present invention.

FIG. 5 illustrates a transmitter circuit 500 according to some embodiments of the present invention. The transmitter circuit 500 includes an oscillator circuit 510 that produces first and second quadrature oscillator signals 515a, 515b. The transmitter circuit 500 further includes a frequency doubling vector modulator circuit 520, e.g., a modulator circuit along the lines of the modulator circuits 400 of FIG. 4, that receives the quadrature oscillator signals 515a, 515b and that produces an output signal 525 having a frequency that is double of that of the oscillator signals 515a, 515b and that is modulated according to a vector modulation signal 521. The output signal 525 is provided to a power amplifier 530, which produces an amplified signal 535 therefrom. The amplified signal 535 may be transmitted in a wireless, wireline or other communications medium.

As shown, the oscillator circuit 510 includes a voltage controlled oscillator (VCO) circuit 512 that generates the first quadrature oscillator signal 515a under control of a phase locked loop (PLL) circuit 514. In particular, the PLL circuit 514 generates a control signal 511 for the VCO circuit 512 responsive to the first quadrature oscillator signal 515a, e.g., by comparing the signal 515a to a reference signal within PLL circuit 514. The VCO and PLL circuits 512, 514 may comprise, for example, conventional VCO and PLL circuits, and further detailed description thereof will not be provided herein. The oscillator circuit 510 further includes a phase shifter circuit 516 that generates the second quadrature oscillator signals 515a such that the first and second oscillator signals 515a, 515b have a quadrature phase relationship. It will be appreciated that the phase shifter circuit 516 may comprise, for example, any of a variety of conventional active or passive phase shifter circuits.

Figure 6:
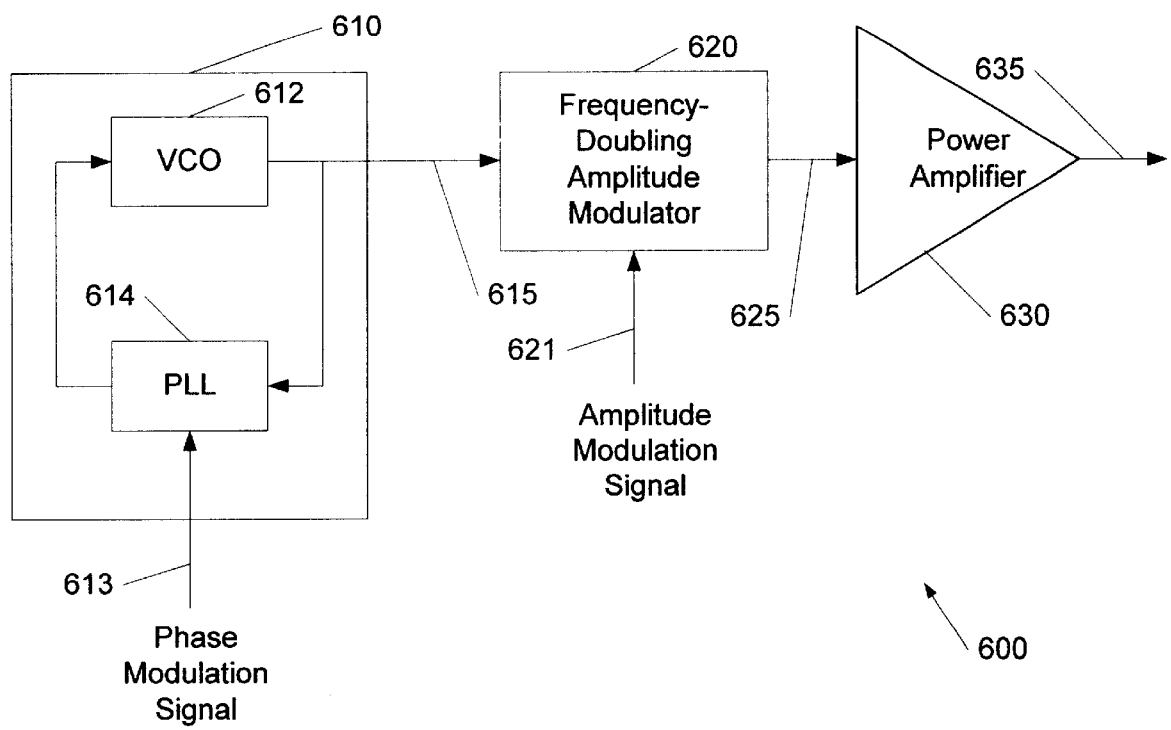
FIG. 6 is a schematic diagram illustrating a transmitter circuit according to further embodiments of the present invention.

According to still other embodiments of the invention, a frequency-doubling amplitude modulator circuit may be combined with an oscillator circuit that is phase modulated. For example, as illustrated in FIG. 6, a transmitter circuit 600 according to embodiments of the present invention includes a phase modulating oscillator circuit 610 that produces an oscillator signal 615 that is phase modulated responsive to a phase modulation signal 613. As shown, the oscillator circuit 610 includes a VCO circuit 612 that generates the oscillator signal 615 under control of a PLL circuit 614. The PLL circuit 614 controls the VCO circuit 612 responsive to the phase modulation signal 613 such that the phase of the oscillator signal 615 varies responsive to the phase modulation signal 613. The transmitter circuit 600 further includes a frequency doubling amplitude modulator circuit 620 that receives the oscillator signal 615 and that produces an output signal 625 having a frequency that is double that of the oscillator signal 615 and that is amplitude modulated according to an amplitude modulation signal 621. The output signal 625 is provided to a power amplifier 630, which produces an amplified signal 635 therefrom. The amplified signal 635 may be transmitted in a wireless, wireline or other communications medium.

Figure 7:
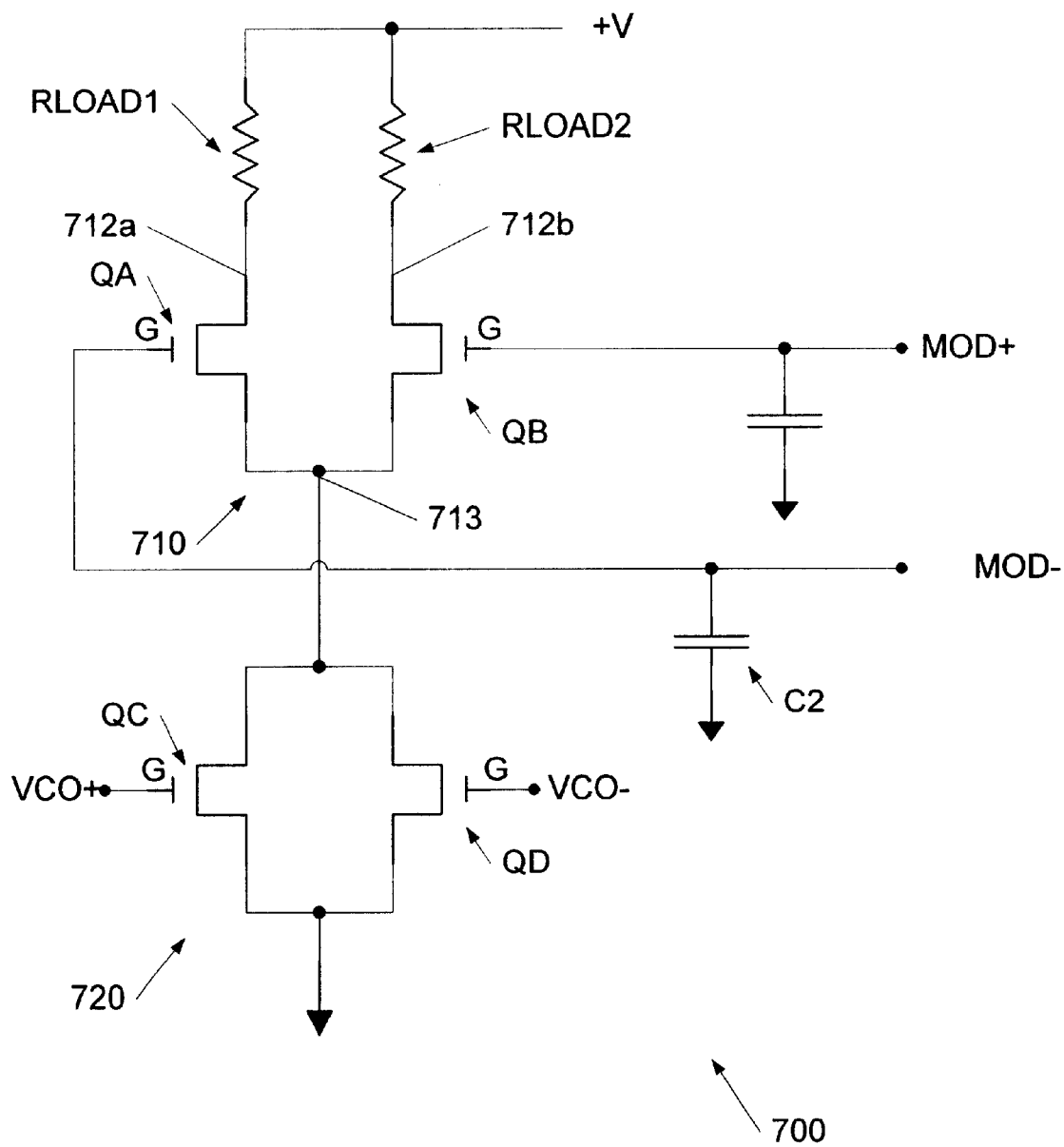
FIG. 7 is a schematic diagram illustrating a modulator circuit according to some embodiments of the present invention.

In applications such as that illustrated in FIG. 6, a relatively simplified modulator configuration along the lines illustrated in FIG. 7 may be used. Referring to FIG. 7, a frequency doubling amplitude modulator circuit 700 according to embodiments of the present invention includes a differential amplifier circuit 710 that includes a differential pair of transistors QA, QB, and which controls currents passing from first and second nodes 712A, 712B to third node 713 responsive to a differential pair of modulation signals MOD+, MOD− applied to modulation signal inputs of the amplifier circuit 710, here, gate terminals G of the transistors QA, QB. An input filter circuit, here shown as including capacitors C1, C2, may be provided at the modulation signal inputs of the amplifier circuit 710. In radio-frequency transmitter applications, the input filter may be configured to attenuate radio-frequency signal components at the modulation signal inputs of the amplifier circuit 710. A shunt transistor or equivalent circuitry (not shown) may be provided in the differential amplifier circuit 710 to reduce flicker noise in the modulator circuit 700.

The modulator circuit 700 further includes a second differential amplifier circuit 720 coupled to the third node 713 of the first differential amplifier circuit 710. The second differential amplifier circuit 720 includes a differential pair of transistors QC, QD, and is responsive to a differential pair of oscillator signals VCO+/− applied to the transistors QC, QD. The modulator circuit 700 is operative to generate a signal, e.g., a voltage between the first and second nodes 712A, 712B of the differential amplifier circuit 710, that is doubled in frequency with respect to the oscillator signals VCO+/−, and that is modulated according to the modulation signals MOD+/−.

Figure 8:
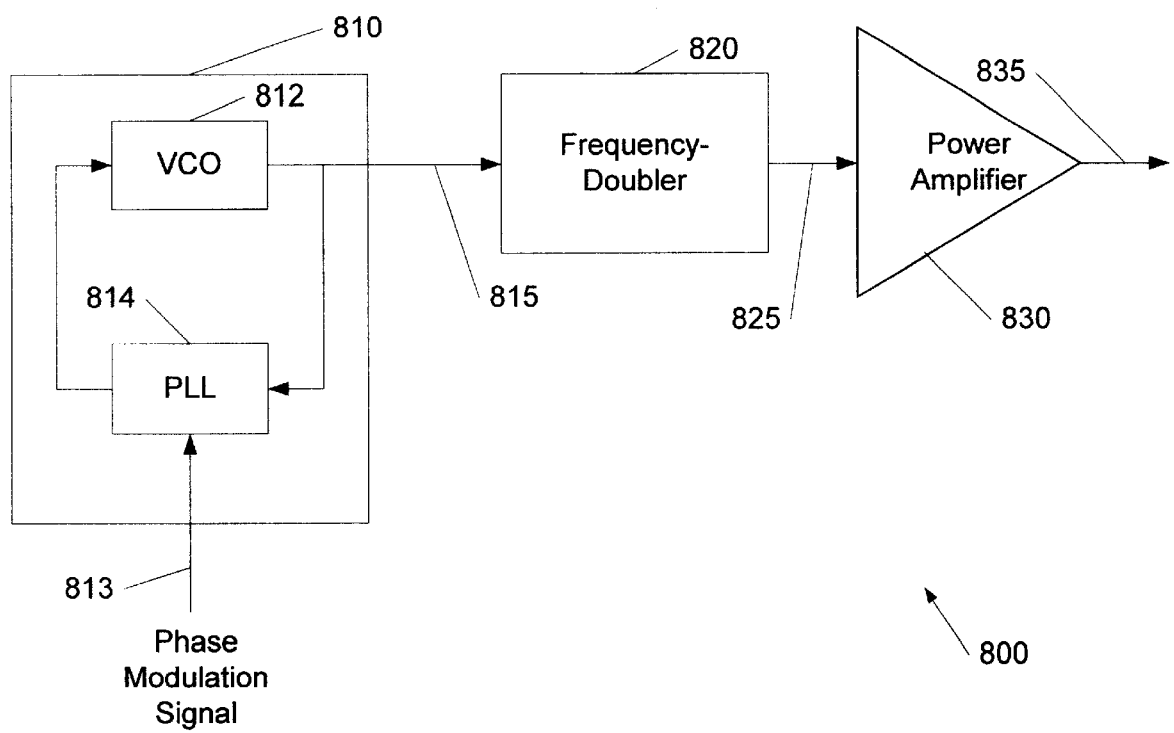
FIG. 8 is a schematic diagram illustrating a transmitter circuit according to additional embodiments of the present invention.

According to other embodiments of the present invention, the architecture of FIG. 7 can be modified in applications in which amplitude modulation is not desired. According to embodiments of the present invention illustrated in FIG. 8, a transmitter circuit 800 includes an oscillator circuit 810 that includes a VCO circuit 812 that is controlled by a PLL circuit 814 responsive to a phase modulation signal 813. The oscillator circuit 800 produces a phase modulated oscillator signal 815 that is applied to a frequency doubler circuit 820. The frequency doubler circuit 820 produces a phase-modulated output signal 825 that has a frequency that is double of that of the oscillator signal 815. The output signal 825 is applied to a power amplifier circuit 830, that produces an amplified signal 835 therefrom. The frequency doubler circuit 820 may, for example, take the form of the circuit 700 illustrated in FIG. 7, with the amplitude modulation signal 721 set to a fixed voltage to provide a fixed gain.

According to embodiments of the invention described herein, an input signal to a transmitter power amplifier is produced from an oscillator signal having a frequency that is one-half of the power amplifier input signal. This can provide several advantages. For example, in transmitter circuits in which the oscillator signal is produced using a VCO circuit to generate the oscillator signal, this frequency doubling can help reduce negative effects of the output of the power amplifier on the phase of the VCO circuit output.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transmitter circuit, comprising:
   an oscillator circuit operative to generate first and second oscillator signals in quadrature relationship to one another;
   a frequency doubling modulator circuit configured to receive the first and second oscillator signals and a modulation signal, the frequency doubling modulator circuit operative to produce an output signal that is modulated according to the modulation signal; and
   a power amplifier circuit responsive to the output signal produced by the frequency doubling modulator circuit and operative to generate an amplified output signal therefrom.

2. The transmitter circuit of claim 1, wherein the first and second oscillator signals have a first frequency and wherein the output signal produced by the frequency doubling modulator circuit has a second frequency about two times the first frequency.

3. The transmitter circuit of claim 1, wherein the frequency doubling modulator circuit comprises:
   a modulation signal input; and
   an input filter circuit coupled to the modulation signal input and operative to attenuate a radio frequency signal component at the modulation signal input.

4. The transmitter circuit of claim 3, wherein the input filter circuit comprises a filter capacitance coupled between the modulation signal input and a signal ground.

5. The transmitter circuit of claim 1, wherein the modulation signal comprises quadrature first and second modulation signals and wherein the frequency doubling modulator circuit comprises a frequency doubling vector modulator circuit.

6. The transmitter circuit of claim 1:
wherein the modulation signal comprises an amplitude modulation signal;
wherein the frequency doubling modulator circuit is operative to amplitude modulate the output signal responsive to the amplitude modulation signal; and
wherein the oscillator circuit is operative to phase modulate the first and second oscillator signals responsive to a phase modulation signal.

7. The transmitter circuit of claim 1, wherein the oscillator circuit comprises a phase locked loop circuit.

8. The transmitter circuit of claim 1:
wherein the first and second oscillator signals comprise respective first and second differential pairs of oscillator signals;
wherein the modulation signal comprises a differential pair of modulation signals; and
wherein the frequency doubling modulator circuit comprises:
first and second cross-coupled differential amplifier circuits that control first and second currents passing from first and second nodes to respective third and fourth nodes responsive to the differential pair of modulation signals; and
third and fourth differential amplifier circuits coupled to respective ones of the third and fourth nodes of the first and second differential amplifier circuits an operative to control current transfer therefrom responsive to respective ones of the first and second differential pairs of oscillator signals.

9. The transmitter circuit of claim 8, wherein the output signal comprises a combination of voltages generated at the first and second nodes of the first and second differential amplifier circuits.

10. The transmitter circuit of claim 9, wherein the output signal comprises a voltage between the first and second nodes.

11. The transmitter circuit of claim 8:
wherein the differential pair of modulation signals comprises first and second differential pairs of modulation signals; and
wherein the first and second cross-coupled differential amplifier circuits are responsive to respective ones of the first and second differential pairs of modulation signals.

12. A transmitter circuit, comprising:
a phase modulating oscillator circuit operative to generate an oscillator signal that has a first frequency and that is phase modulated responsive to a phase modulation signal;
a frequency doubler circuit configured to receive the phase-modulated signal and operative to produce an output signal therefrom that has a second frequency; and
a power amplifier circuit responsive to the output signal produced by the frequency doubler circuit and operative to generate an amplified output signal therefrom.

13. The transmitter circuit of claim 12, wherein the second frequency is about two times the first frequency.

14. The transmitter circuit of claim 12, wherein the frequency doubler circuit comprises a frequency doubling amplitude modulator circuit operative to amplitude modulate the output signal responsive to an amplitude modulation signal.

15. The transmitter circuit of claim 14, wherein the frequency doubling amplitude modulator circuit comprises:
a modulation signal input; and
an input filter circuit coupled to the modulation signal input and operative to attenuate a radio frequency signal component at the modulation signal input.

16. The transmitter circuit of claim 15, wherein the input filter circuit comprises a filter capacitance coupled between the modulation signal input and a signal ground.

17. The transmitter circuit of claim 14:
wherein the oscillator signal comprises a differential pair of oscillator signals;
wherein the modulation signal comprises a differential pair of modulation signals; and
wherein the frequency doubling amplitude modulator circuit comprises:
a first differential amplifier circuit that controls first and second currents passing from first and second nodes to a third node responsive to the differential pair of modulation signals; and
a second differential amplifier circuit coupled to the third node of the first differential amplifier circuit and operative control current transfer therefrom responsive to the differential pair of oscillator signals.

18. A transmitter circuit, comprising:
an oscillator circuit operative to generate first and second differential pairs of oscillator signals in quadrature relationship to one another;
a modulator circuit configured to receive the first and second oscillator signals and a modulation signal, the modulator circuit comprising:
first and second cross-coupled differential amplifier circuits that control first and second currents passing from first and second nodes to respective third and fourth nodes responsive to a differential pair of modulation signals; and
third and fourth differential amplifier circuits coupled to respective ones of the third and fourth nodes of the first and second differential amplifier circuits and operative to control current flow therebetween responsive to respective ones of the first and second differential pairs of oscillator signals; and
a power amplifier circuit responsive to the output signal produced by the modulator circuit and operative to generate an amplified output signal therefrom.

19. The transmitter circuit of claim 18, wherein the first and second differential pairs of oscillator signals have a first frequency, and wherein the output signal produced by the modulator circuit has a second frequency about two times the first frequency.

20. The transmitter circuit of claim 18, wherein the output signal produced by the modulator circuit comprises a combination of voltages generated at the first and second nodes of the first and second differential amplifier circuits.

21. The transmitter circuit of claim 18, further comprising an input filter circuit coupled to modulation signal inputs of the first and second differential amplifier circuits and operative to attenuate a radio frequency signal component.

22. The transmitter circuit of claim 18:
wherein the differential pair of modulation signals comprises first and second differential pairs of modulation signals; and wherein the first and second cross-coupled differential amplifier circuits control respective ones of the first and second currents passing from the first and second nodes to respective ones of the third and fourth nodes responsive to respective ones of the first and second differential pairs of modulation signals.

23. A transmitter circuit, comprising:

an oscillator circuit operative to generate an oscillator signal;

means, operatively associated with the oscillator circuit, for producing a frequency-doubled phase-modulated output signal from the oscillator signal, the frequency-doubled phase-modulated output signal phase modulated according to a modulation signal; and a power amplifier responsive to the frequency-doubled phase-modulated output signal and operative to generate an amplified output signal therefrom.

24. The transmitter circuit of claim 23, wherein the oscillator circuit has a first frequency, and wherein the frequency-doubled phase-modulated output signal has a second frequency about two times the first frequency.

25. The transmitter circuit of claim 23:

wherein the means for producing a frequency-doubled phase-modulated output signal comprises:
means for phase modulating the oscillator signal responsive to a phase modulation signal; and
a frequency doubler circuit that generates the frequency-doubled phase-modulated output signal from the phase modulated oscillator signal.

26. The transmitter circuit of claim 25, wherein the frequency doubler circuit comprises a frequency doubling amplitude modulator circuit operative to amplitude modulate the frequency-doubled phase-modulated output signal according to an amplitude modulation signal.

27. The transmitter circuit of claim 23:

wherein the oscillator circuit is operative to generate first and second quadrature oscillator signals having a quadrature relationship to one another; and wherein the means for producing a frequency-doubled phase-modulated output signal comprises means for modulating a combination of the first and second quadrature oscillator signals of the modulation signal.

28. The transmitter circuit of claim 27, wherein the modulation signal comprises first and second quadrature modulation signals.

29. A method of operating a transmitter, comprising:

generating an oscillator signal having a first frequency;

producing a frequency-doubled modulated output signal from the oscillator signal, the frequency-doubled modulated output signal phase modulated according to a modulation signal and having a second frequency that is about twice the first frequency;

amplifying the frequency-doubled modulated output signal; and transmitting the amplified frequency-doubled modulated output signal in a communications medium.

30. The method of claim 29:

wherein generating the oscillator signal comprises phase modulating the oscillator signal according to a phase modulation signal to produce a phase modulated oscillator signal; and wherein producing a frequency-doubled phase-modulated output signal comprises generating the frequency-doubled phase-modulated output signal from the phase modulated oscillator signal.

31. The method of claim 30, wherein generating the frequency-doubled phase-modulated output signal from the phase modulated oscillator signal comprises amplitude modulating the phase modulated output signal according to an amplitude modulation signal to generate the frequency-doubled phase-modulated output signal.

32. The method of claim 29:

wherein generating an oscillator signal comprises generating first and second quadrature oscillator signals having a quadrature relationship to one another; and wherein producing a frequency-doubled phase-modulated output signal comprises modulating a combination of the first and second quadrature oscillator signals of the modulation signal.

33. The method of claim 32, wherein the modulation signal comprises first and second quadrature modulation signals.

* * * * *